United States Patent
Chen et al.

(10) Patent No.: US 7,816,253 B2
(45) Date of Patent: Oct. 19, 2010

(54) SURFACE TREATMENT OF INTER-LAYER DIELECTRIC

(75) Inventors: Shyng-Tsong Chen, Patterson, NY (US); Qinghuang Lin, Yorktown Heights, NY (US); Kelly Malone, Poughkeepsie, NY (US); Sanjay Mehta, Slingerlands, NY (US); Terry A. Spooner, New Fairfield, CT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 894 days.

(21) Appl. No.: 11/308,422

(22) Filed: Mar. 23, 2006

(65) Prior Publication Data

US 2007/0222081 A1    Sep. 27, 2007

(51) Int. Cl.
*H01L 21/76* (2006.01)
*H01L 21/425* (2006.01)
*H01L 21/4763* (2006.01)

(52) U.S. Cl. .................. 438/622; 438/421; 438/422; 438/514; 438/515; 438/533; 438/625; 438/712; 438/717; 257/E21.029; 257/E21.226; 257/E21.241; 257/E21.252; 257/E21.256

(58) Field of Classification Search .......... 257/E21.029, 257/E21.226, E21.241, E21.252, E21.256, 257/E21.257, E21.579
See application file for complete search history.

(56) References Cited

U.S. PATENT DOCUMENTS

| | | | |
|---|---|---|---|
| 5,814,194 A * | 9/1998 | Deguchi et al. | 204/192.1 |
| 5,970,376 A | 10/1999 | Chen | |
| 6,284,644 B1 | 9/2001 | Aug et al. | |
| 6,613,240 B2 * | 9/2003 | Skinner et al. | 216/38 |
| 7,253,098 B2 * | 8/2007 | Chen et al. | 438/637 |
| 7,538,028 B2 | 5/2009 | Sandu et al. | |
| 2003/0232495 A1 | 12/2003 | Moghadam et al. | |
| 2005/0087516 A1 | 4/2005 | Duerksen et al. | |
| 2005/0087769 A1 * | 4/2005 | Yamazaki et al. | 257/202 |
| 2005/0127417 A1 | 6/2005 | Saenger et al. | |
| 2005/0266691 A1 * | 12/2005 | Gu et al. | 438/706 |
| 2005/0272237 A1 | 12/2005 | Hautala et al. | |
| 2005/0272265 A1 * | 12/2005 | Geffken et al. | 438/706 |
| 2006/0046472 A1 | 3/2006 | Sandhu et al. | |
| 2007/0042609 A1 | 2/2007 | Senkevich et al. | |
| 2007/0117342 A1 * | 5/2007 | Chen et al. | 438/401 |
| 2007/0125747 A1 * | 6/2007 | Otsuka et al. | 216/66 |

(Continued)

OTHER PUBLICATIONS

John Hautala et al., (Infusion Processing: An Alternative to Plasma Technology for Semiconductor Device Manufacturing, Sep. 21, 2005.*

(Continued)

*Primary Examiner*—Charles D Garber
*Assistant Examiner*—Mohsen Ahmadi
(74) *Attorney, Agent, or Firm*—Yuanmin Cai

(57) ABSTRACT

When an interconnect structure is built on porous ultra low k (ULK) material, the bottom of the trench and/or via is usually damaged by a following metallization process which may be suitable for dense higher dielectric materials. Embodiment of the present invention may provide a method of forming an interconnect structure on an inter-layer dielectric (ILD) material. The method includes steps of treating an exposed area of said ILD material to create a densified area, and metallizing said densified area.

6 Claims, 8 Drawing Sheets

U.S. PATENT DOCUMENTS

2007/0173071 A1 7/2007 Afzali-Ardakani et al.
2007/0275569 A1 11/2007 Moghadam et al.
2009/0072401 A1 3/2009 Arnold et al.
2009/0087577 A1 4/2009 Russell et al.
2009/0098186 A1 4/2009 Kirkpatrick et al.

OTHER PUBLICATIONS

Hautala et al. "Infusion Porcessing: An Alternative to Plasma Technology for Semiconductor Device Manufacturing", Electrochemical Society Symposium on ULSI Process Integration IV, May 2005, Quebec, Canada, PV 2005-06, p. 118.

U.S. Appl. No. 11/609,040, "Office Action", Dated Mar. 23, 2010.

U.S. Appl. No. 11/609,040, "Office Action", Dated Nov. 25, 2009.

U.S. Appl. No. 11/609,040, Method of Repairing Process induced dielectric damage by the use of GCIB surface treatment using gas clusters of organic molecular species, Chen et al, Filed Dec. 11, 2006.

* cited by examiner

SURFACE TREATMENT OF INTER-LAYER DIELECTRIC

FIELD OF THE INVENTION

The current invention relates to the field of semiconductor device manufacturing. In particular, it relates to a process of providing treatment to surfaces of an interconnect structure after etching and before metallization.

BACKGROUND OF THE INVENTION

Recent rapid advancement in semiconductor technology has brought the advent of very large scale integrated (VLSI) as well as ultra large scale integrated (ULSI) circuitries, resulting in integration of more devices into smaller areas on a single semiconductor substrate. In order to further enhance performance of the VLSI and/or ULSI circuitries, ultra-low dielectric constant (ULK) materials, such as porous materials, are being used as inter-layer dielectric (ILD) to further reduce capacitance such as, for example, inter-layer capacitance and/or other parasitic capacitance that may be undesirable to the performance such as speed of the VLSI and/or ULSI circuitries. Interconnect structures made of metal lines or contacts, such as copper (Cu) for example, are usually formed in and around the porous ULK ILD to connect semiconductor devices on the substrate.

An interconnect structure, which may include trenches and vias, may be formed by first creating a pattern of a three-dimensional interconnect structure in the ILD of a porous ULK material. As is known in the art, the structure or pattern may be formed through processes such as lithography and etching, e.g., a reactive ion etching (RIE). Subsequently, a metal element or material may be deposited onto the trenches and/or vias of the formed structure pattern to create metal contact lines. Excess metal being deposited on the surface of the ULK ILD may be removed through a chemical mechanical planarization (CMP) process. On the other hand, it is also known in the art that depositing a Cu barrier metal (liner), such as Ta/TaN, onto a surface of a porous ULK ILD using a conventional surface cleaning process designed or optimized for dense ILD build may cause element of the metal to penetrate or intrude into the porous material of the ULK ILD. This penetration or intrusion of metal element into porous ULK ILD may cause performance degradation of the metal contacts formed thereon and, in a worst case, shortage of the semiconductor devices that the interconnect structure intends to connect.

BRIEF DESCRIPTION OF THE DRAWINGS

The present invention will be understood and appreciated more fully from the following detailed description of the invention, taken in conjunction with the accompanying drawings of which.

Figure 1:
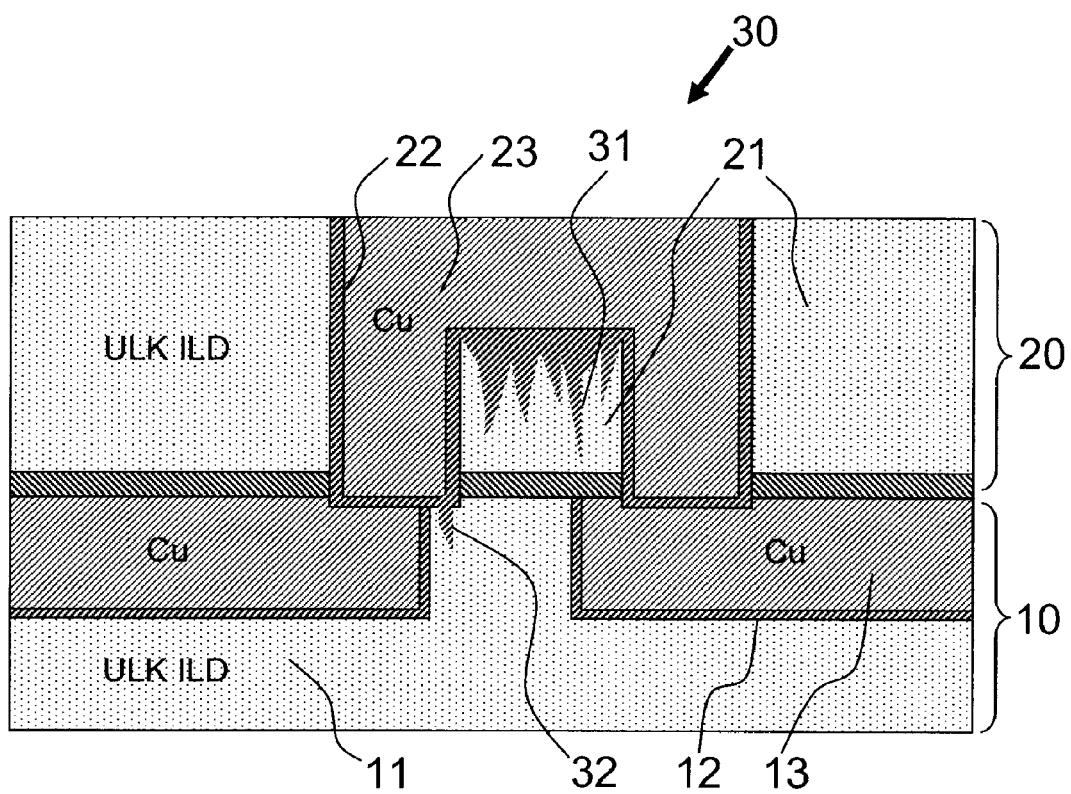
FIG. 1 is a schematic illustration of a conventional interconnect structure as is known in the art.

It will be appreciated that for simplicity and clarity of illustration, elements shown in the drawings have not necessarily been drawn to scale. For example, the dimensions of some of the elements may be exaggerated relative to other elements for clarity purpose.

SUMMARY OF THE INVENTION

The current invention provides a process and method of densifying exposed areas of a porous ULK material at the bottom surfaces of an interconnect structure. The surface treatment of densification may be performed through irradiation, and the irradiation may be conducted by applying a Gas Cluster Ion Beam (GCIB).

According to one embodiment of the invention, the size of a typical gas cluster used in the GCIB process may be around, e.g., 5 nm, which is bigger than the size of a typical pore, which is around, e.g., 1~2 nm, inside a porous ULK material. Therefore, surface treatment by a GCIB process may not cause changes in the property of the bulk ULK material. In the mean time, the GCIB surface treatment may create a smooth layer of densified surface in the ULK dielectric material. According to one embodiment of the invention, the thickness of a densified layer may be controlled preferably by an acceleration voltage used in the GCIB process. According to another embodiment, the thickness of a densified layer may be from 10 Å to 500 Å, and may be preferably in the range of 50 Å-250 Å.

After the surface treatment through densification, a conventional metallization process may follow by first cleaning the surface of the interconnect structure, and then depositing a metal liner followed by a metal filler in the trench and/or via areas of the interconnect structure. Because the metallization process will now experience a "dense" ILD at the bottom of the trench and/or via, it may not cause roughness to the bottom surface or elements of the metal liner to intrude or penetrate into the underneath porous ULK ILD material. After the build of the interconnect structure is completed, the densified layer may remain inside the porous ILD material. In addition, embodiment of the present invention may enable a dual damascene build for both metal line and via in a porous ULK ILD material.

Embodiments of the present invention provide a process or method of forming an interconnect structure on an inter-layer dielectric material. The method includes steps of providing treatment to an exposed area of the ILD material to create a densified area, and metallizing the densified area.

According to one embodiment, the exposed area is a bottom surface of a trench created in the ILD material. According to another embodiment, the exposed area is part of a bottom surface of a trench or via created in the ILD material.

According to embodiments of the invention, the ILD material may be a porous material of ultra-low dielectric constant (ULK), and may be a silicon dioxide ($SiO_2$), a silicon oxycarbide (SiCOH), a methylsilsesquioxane (MSQ), a hydrosilsequioxane, a hydrogenated amorphous silicon carbide (SiCH), a hydrogenated amorphous silicon carbon nitride (SiCNH), or a silicon nitride (SiNx).

Embodiments of the present invention may further provide a method of treating the exposed area of the ILD material by irradiating the exposed area using a GCIB.

According to one embodiment, the GCIB may be used at a dosage of approximately between 0.1 and $10.0 \times 10^{15}$ ion-clusters/cm$^2$, and preferably between 0.5 and $2.5 \times 10^{15}$ ion-clusters/cm$^2$.

According to another embodiment, the GCIB may be accelerated at a voltage of approximately between 1.0 and 60 KeV, and preferably between 5 and 15 KeV.

According to yet another embodiment, the GCIB may be generated through a pure or a mixture of inert and reactive gases. The inert gases may include one or more gases of argon, neon, krypton, xenon, radon, nitrogen, and oxygen.

According to one embodiment of the invention, the densified area may have a layer of thickness from 10 Å to 500 Å, and preferably from 50 Å to 250 Å.

Embodiments of the present invention may further provide a method of forming a bottom surface of the interconnect structure to create an exposed area of the ILD material.

Embodiments of the present invention may provide an interconnect structure in a semiconductor chip for connecting one or more semiconductor devices. The interconnect structure may include at least one densified area on a surface of an ILD material, and the densified area may be formed through irradiation treatment of the ILD material with a GCIB.

According to one embodiment, the densified area may include a bottom surface of a trench formed in the ILD material. According to another embodiment, the densified area may include part of a bottom surface of a via created in the ILD material.

According to one embodiment, the interconnect structure may further include a metal liner deposited on top of the densified area and a metal filler deposited on top of the metal liner, and the ILD material may be a silicon dioxide (SiO2), silicon oxycarbide (SiCOH), methylsilsesquioxane (MSQ), hydrosilsequioxane, hydrogenated amorphous silicon carbide (SiCH), hydrogenated amorphous silicon carbon nitride (SiCNH), or silicon nitride (SiNx).

Embodiment of the invention may provide a semiconductor device having at least one interconnect structure formed on an ILD material. The interconnect structure may include one or more densified areas formed on one or more bottom surfaces of the interconnect structure.

According to one embodiment, at least one of the densified areas may form a layer, and the layer may have a thickness from 10 Å to 500 Å, and preferably from 50 Å to 250 Å.

DETAILED DESCRIPTION OF THE INVENTION

As is known in the art, manufacture of a semiconductor device may include processing of, for example, a front end of line (FEOL) and a back end of line (BEOL). During a FEOL processing, semiconductor devices such as, for example, switches and logic gates may be produced. These devices may be interconnected through one or more interconnect structures. The interconnect structures may be produced through a BEOL processing.

A conventional BEOL processing may include steps such as, for example, cap deposition, ILD deposition, hard mask or photo-mask deposition, lithography, and etching, among other steps. For the interest of not obscuring the presentation of the essences of present invention, processing steps that are well known in the art may not be described below in detail, but rather the following description will focus on the distinctive elements of the present invention.

FIG. 1 is a schematic illustration of an interconnect structure as is known in the art. Interconnect structure 30 may be created in an ULK ILD layer 20, which may be formed on top of a prior ULK ILD layer 10. ULK ILD Layer 10 may include a porous material 11, and thereon may be formed one or more interconnect structures such as, for example, metal contact or metal filler 13 deposited or filled on top of barrier metal film or liner 12. Similarly, ULK ILD layer 20 may include a porous material 21. Interconnect structure 30 may include metal contact or metal filler 23 filled or deposited on top of barrier metal film or liner 22.

During a metallization process, due to a plasma cleaning process which is typically employed in the creating of interconnections in a dense ILD material, in and around an area between metal contact 23 and porous material 21, there may be formed a liner 22 which may not have a smooth surface and often have a rough interface with porous material 21 underneath it. As is known in the art, the surface of porous material 21 may be damaged during the plasma cleaning process and spike-like extrusions such as, for example, "spikes" 31 and 32 as illustrated in FIG. 1 may penetrate into porous material 21 underneath liner 22. In other words, metal elements of liner 22 may penetrate into "holes" of porous ULK material 21. This roughness between the metal interconnect structure 30 and its underlining inter-layer dielectric may cause performance degradation of the metal contact or interconnect. For example, in one instance, a deep "spike" may cause shortage among different semiconductor devices.

Figure 2:
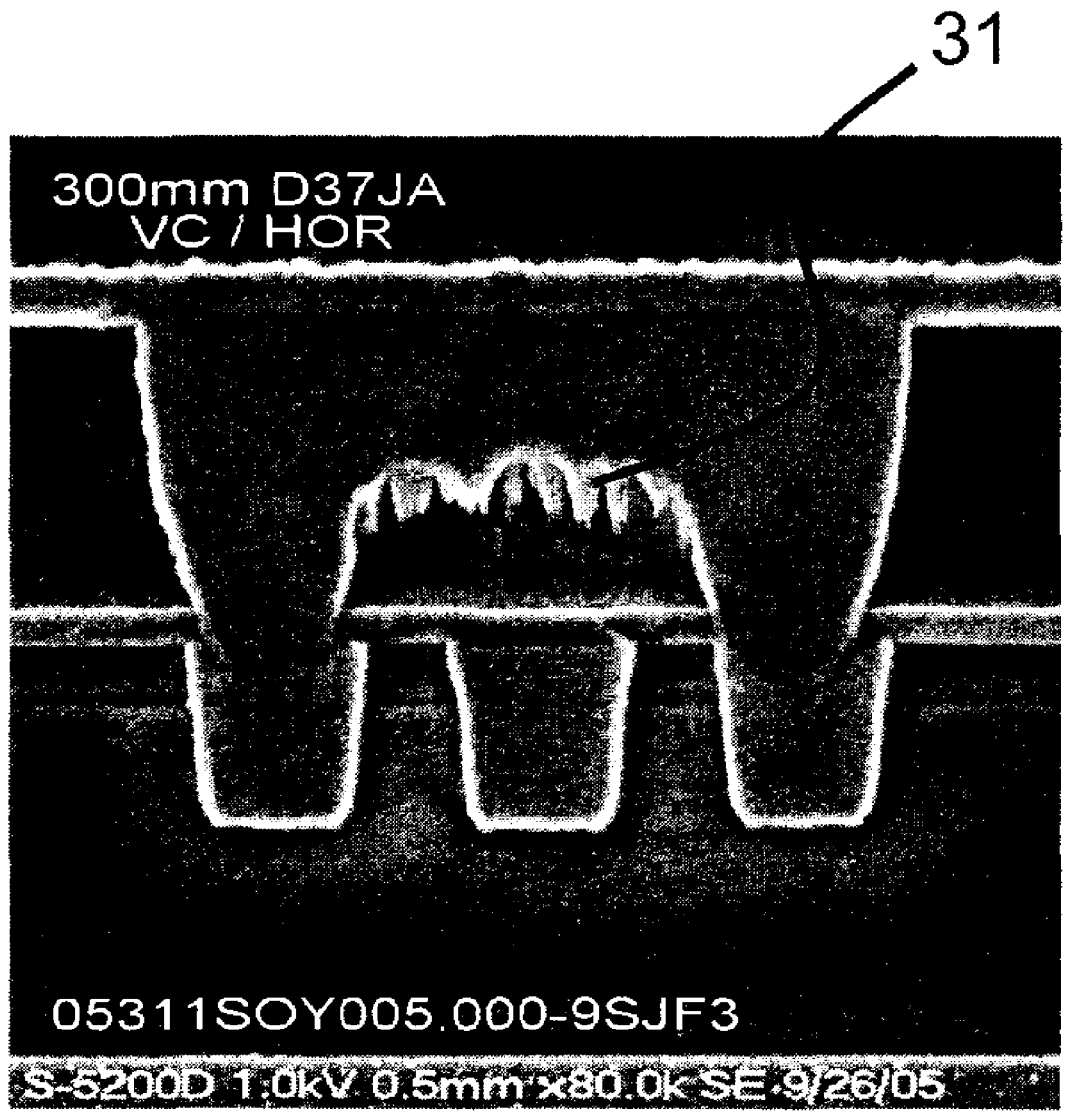
FIG. 2 is an illustration of a sample interconnect structure formed by following a conventional process as is known in the art.

FIG. 2 is an illustration of a sample interconnect structure formed by following a conventional process as is known in the art. As described above with regard to FIG. 1, due to the porous nature of ULK material of the ILD layer, a plasma sputtering clean action or process, which is normally applied to the surface before the deposition of a barrier metal film or liner for the formation of trenches and vias, caused damages to the porous material. This results in the roughness of metal liner at the surface of the ILD layer forming the bottom of a trench, as evidenced by extrusion or "spike" 31.

Figure 3:
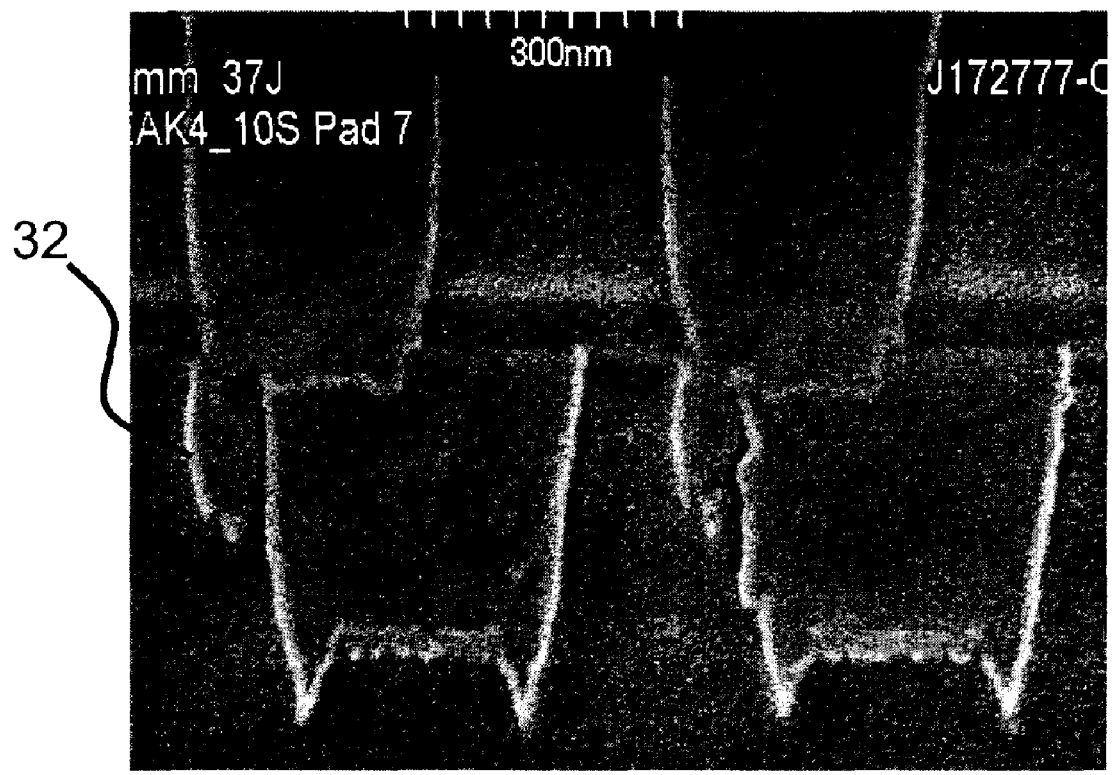
FIG. 3 is an illustration of another sample interconnect structure formed by following a conventional process as is known in the art.

FIG. 3 is an illustration of another sample interconnect structure formed by following a conventional process as is known in the art. As described above with regard to FIG. 1, the existence of extrusion or "spike" 32 in FIG. 3 indicates that metal elements of a barrier metal file or liner of an interconnect structure in the current (top) ULK ILD layer may have penetrated or intruded into the porous material of a prior (bottom) ULK ILD layer. The porous material of bottom ULK ILD layer may have been exposed at the bottom of the via of the interconnect structure in the top ULK ILD layer, due to a misalignment, between the two different ILD layers, caused during the patterning process of vias.

According to embodiments of the invention, issues relating to metal intrusion into a neighboring porous ULK ILD layer may be resolved by applying a post RIE surface treatment of the ILD layer. The surface treatment may be applied after an area for interconnect structure is created through etching but before a subsequent conventional metallization process is applied. According to one embodiment of the invention, the surface treatment may seal at least some pores of the ULK ILD layer, and therefore may increase a density of the ULK material in a region close to the proximity of the surface, which in turn may enhance resistance of the surface to possible chemical and mechanical damages caused by subsequent processing steps in the formation of the interconnect structure.

Figure 4:
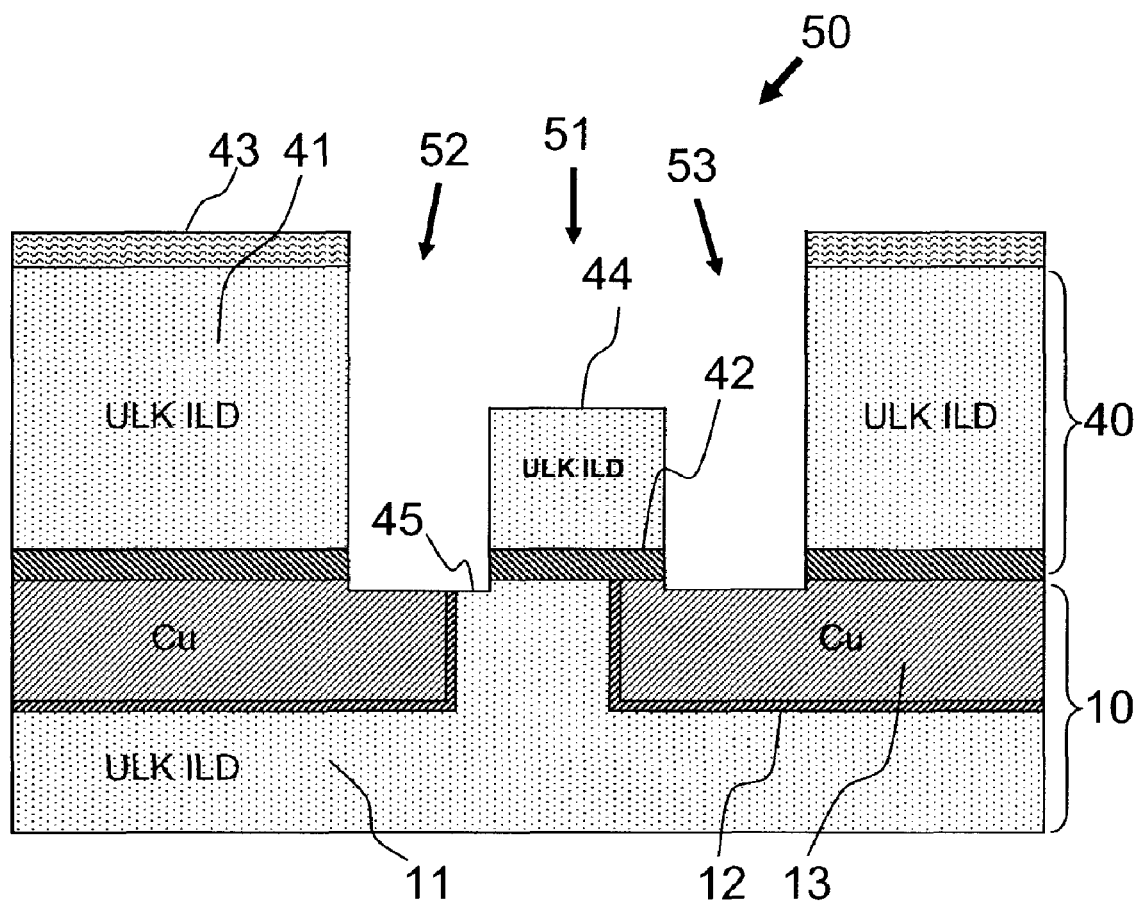
FIG. 4 is a schematic illustration of a method of forming an interconnect structure according to one embodiment of the invention.

FIG. 4 is a schematic illustration of a method of forming an interconnect structure according to one embodiment of the invention. Interconnect structure 50 may be created in a porous ULK ILD layer 40 which may be on top of a porous ULK ILD layer 10 of a prior layer. However, the invention is not limited in this respect and interconnect structure 50 may be created in materials other than a porous material, and layer 40 may or may not be an ULK ILD layer. In addition, ULK ILD layer 40 may or may not be on top of another ULK ILD layer such as ULK ILD layer 10. ULK ILD layer 10 may have an interconnect structure formed thereon such as, for example, a metal contact 13 deposited or plated or filled on top of a barrier metal film or liner 12. However, the invention is not limited in this respect and ULK ILD layer 10 may not be and/or may not necessarily contain any interconnect structures at all.

Interconnect structure 50 may be formed through processing steps as briefly described below. First, a cap layer 42 may be formed on ULK ILD layer 10 through, for example, a sputtering deposition process. On top of cap layer 42, a layer of porous ULK material 41 may be deposited or formed to create an ILD layer. Following the formation or deposition of ULK ILD layer 41, a structure of interconnect structure 50 may be created in ULK ILD layer 41, including a region 51 for forming a trench and regions 52 and 53 for forming vias, through processes such as, for example, selective etching as described below in detail.

For example, a layer of photon-sensitive material may be first applied on top of ULK ILD layer 41. As is known in the art, a lithographic processing technique may be subsequently used to create a photo-mask 43 out of the photon-sensitive layer of material. Photo-mask 43 may include a desired pattern of trenches and/or vias to be created in ULK ILD layer 41.

According to one embodiment of the invention, at least a portion of ULK ILD layer 41 in the area defined by a trench may be subsequently etched away to form a trench region 51. According to another embodiment of the invention, ULK ILD layer 41 and cap layer 42, in areas defined by vias, may be etched away to form regions for vias 52 and 53. According to one embodiment, regions for trench 51 and vias 52 and 53 may be formed partially through same etching steps. But the invention is not limited in this respect and regions for trench 51 and visa 52 and 53 may be formed in different and/or separate steps. The etching may be a reactive ion etching process but the invention is not limited in this respect either, and other etching process such as a wet etching process may be used.

The forming of trench region 51 may create and expose a surface 44 of porous ULK material 41. In addition, misalignment between current and prior levels of interconnect layers in a process of creating vias through lithography may cause exposure of a part of porous ULK material 45 of a prior ILD layer, for example, ULK ILD layer 10, as shown in FIG. 4.

Figure 5:
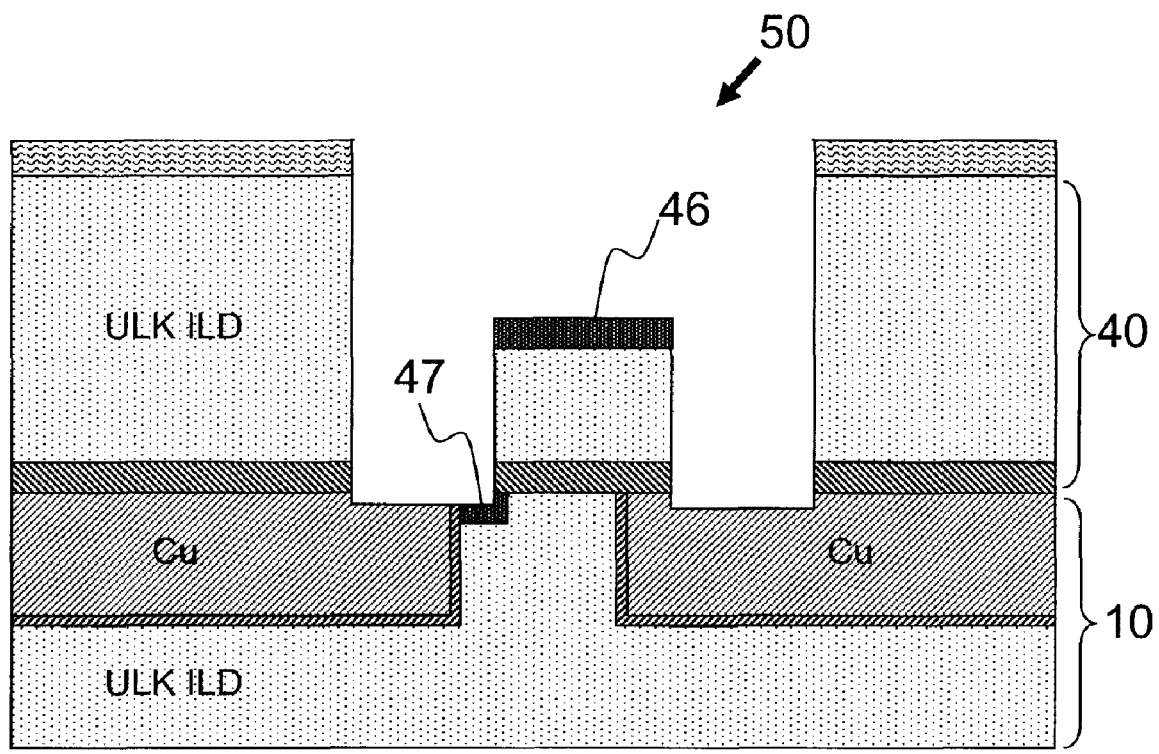
FIG. 5 is a schematic illustration of a method of forming an interconnect structure according to another embodiment of the invention.

FIG. 5 is a schematic illustration of a method of forming an interconnect structure according to another embodiment of the invention. Following the step as described above with regard to FIG. 4 and before applying a conventional metallization process, exposed surfaces of porous materials of layer 10 and layer 40 may be treated, according to one embodiment, to create a layer of densified areas. For example, exposed surfaces 44 and 45 (FIG. 4) of porous materials 41 and 11 may be treated to create densified areas 46 and 47, respectively, which may be subsequently used to prevent metal elements of a liner, such as liner 48 (FIG. 6) to be applied later, from penetrating into porous materials 41 and 11.

Figure 7:
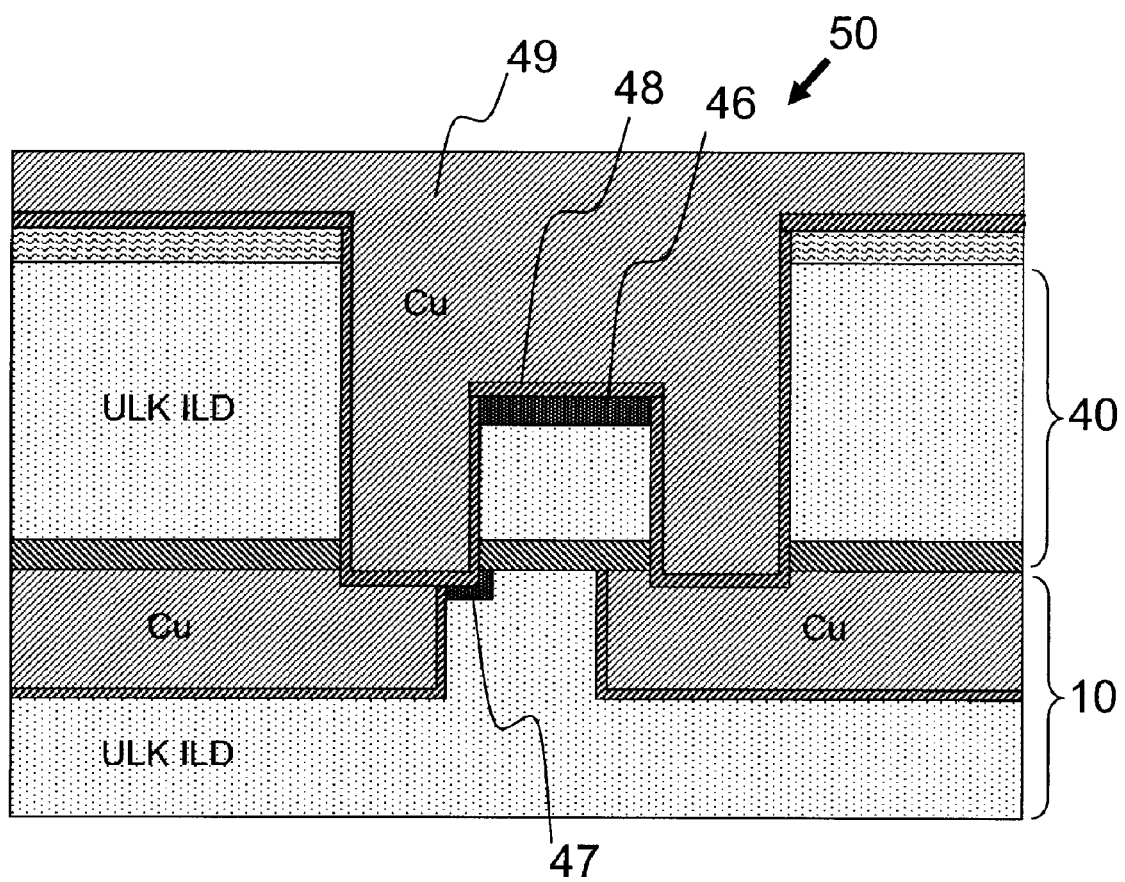
FIG. 7 is a schematic illustration of a method of forming an interconnect structure according to another embodiment of the invention.
Figure 8:
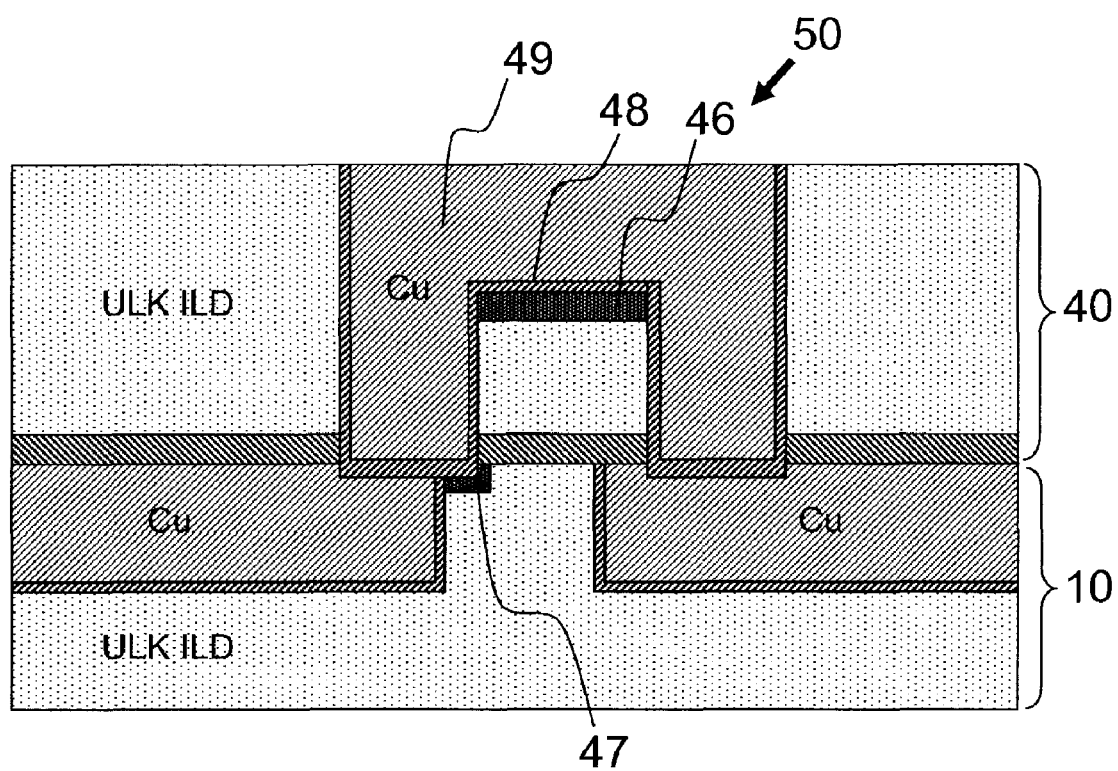
FIG. 8 is a schematic illustration of a method of forming an interconnect structure according to yet another embodiment of the invention.

The surface treatment may be conducted by using a gas cluster ion beam (GCIB) to bombard exposed surfaces of the porous materials. According to one embodiment of the invention, a process of applying GCIB may be a low temperature process where large clusters of ions are used to bombard the surface of the porous materials. The ion beam may be directional, which enables the bombardment of very specific areas of interconnect structure 50 to create densified area 46 upon which a trench is to be formed, and/or densified area 47 upon which a via is formed later, as are illustrated in FIGS. 6-8.

According to some embodiments of the invention, porous ULK materials used as an ILD layer may be designed or selected, and/or to a certain extent optimally selected, to have sizes of pore diameters ranging from, for example, 1-2 nm in order to reduce and/or prevent line to line conduction paths. For porous ULK materials with pore diameters of 1-2 nm, the size of ion clusters used in a GCIB process may be in the order of a few nanometers, for example, 5 nm. However, the invention is not limited in this respect, and the size of the ion clusters may vary depending on, for example, conditions of the GCIB process. In the above case, since the size of the ion clusters is bigger than the size of pore in the porous ULK material, a surface treatment by the GCIB process may densify only a layer of the porous material in proximity to the surface and thus may not cause changes to the property of the bulk ULK material. In comparison, a surface treatment by a conventional plasma process will cause property changes of the bulk porous ULK material in the majority and in worst cases the entire thickness of the ILD layer. This may inadvertently offset some of the advantages of using porous ULK materials as an ILD layer.

As is illustrated in FIG. 5, exposed porous material of ULK ILD such as misaligned via 47 and trench bottom 46 are smoothed through the GCIB densification process. According to one embodiment of the invention, the GCIB process may be adjusted, and/or to a certain extent optimized, by varying a dosage of the ions and/or an accelerating voltage for the ions. In order to reduce, and/or to a certain extent prevent, chemical (etching) or physical (sputtering) removal of the ULK ILD during the GCIB process, benign elements or a mixture of benign and other elements may be used. For example, some ion clusters may include inert gas molecules such as, nitrogen, argon, or other pure gases and/or a mixture of different gases. According to one embodiment, thickness of the densification area or region may be determined by the acceleration voltage of the ion clusters. For example, the thickness of a densified area or region may range between 50-250 Å for BEOL interconnect purposes. However, the invention is not limited in this respect and other thickness may be used for desired performance. As shown in FIG. 5, the post RIE interconnect structure 50 has now densified regions 46 at the bottom of the trench and 47 under the misaligned via. These densified regions 46 and 47 may be more resistant to possible chemical and/or physical damages which may occur during subsequent processing.

Figure 6:
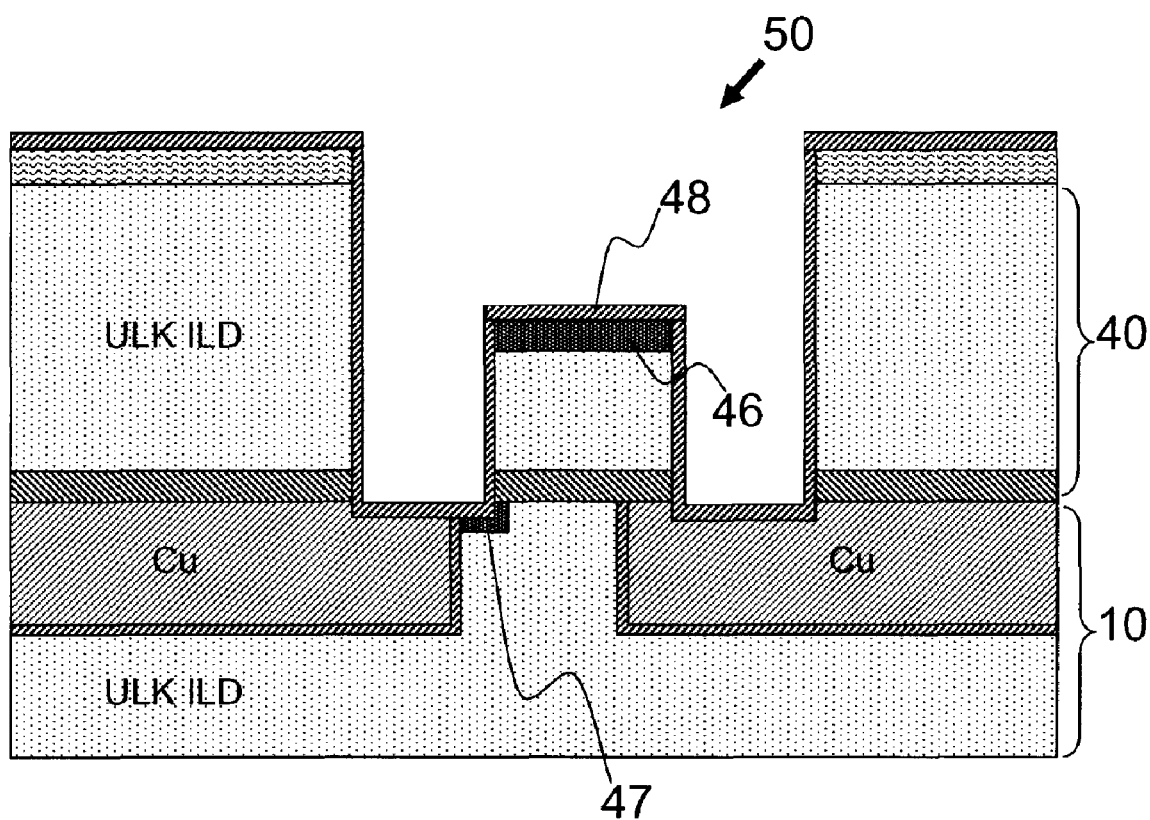
FIG. 6 is a schematic illustration of a method of forming an interconnect structure according to one embodiment of the invention.

FIG. 6 is a schematic illustration of a method of forming an interconnect structure according to one embodiment of the invention. Following the step as described above with regard to FIG. 5, after the exposed surfaces of porous materials of ULK ILD layers 10 and 40 have been treated by the GCIB process, a barrier metal film or liner 48 may be deposited onto the surfaces including regions, such as regions 51, 52 and 53 (FIG. 4), that are etched away for the formation of trenches and vias. Before the deposition of barrier metal film or liner 48, aggressive sputtering and/or etch processes may be applied to clean up the bottom surfaces of the trenches and vias, including the removal of at least part of the densified surface areas 46 and 47. Thus, the GCIB process treated areas 46 and 47 may withstand an intense processing that is typically used for dense ILD materials. As a result, smooth surfaces at the bottom of interconnect structure 50 may be maintained by densified areas 46 and 47. The barrier metal film or liner 48 deposited subsequently at the trench bottom and in the area of the misaligned via may continue to have a relatively smooth profile.

FIG. 7 is a schematic illustration of a method of forming an interconnect structure according to another embodiment of the invention. Following the step as described above with regard to FIG. 6 after deposition of barrier metal film or liner 48, a metal element 49, for example, copper (Cu) that is suitable for interconnecting semiconductor devices may be deposited or filled in the area etched for interconnect structure 50 and to be used as metal contact. Metal element 49 may fill up interconnect structure 50 and in one embodiment may be excessively deposited onto other parts of ILD layer 40 as shown in FIG. 7.

FIG. 8 is a schematic illustration of a method of forming an interconnect structure according to yet another embodiment of the invention. Following the step as described above with regard to FIG. 7 after filling in interconnect structure 50 with metal element 49, surface of the plated interconnect structure 50 or surface of ILD layer 40 may be subjected to a planarization process such as, for example a CMP process, to remove excess metal element 49 and other processing related layers such as, for example, photo-mask layer 43 (FIG. 4) and/or liner 48 outside interconnect structure 50. In addition, the CMP process may prepare the surface of ILD layer 40 for a further processing such as, for example, for the formation of a subsequent layer of interconnect.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming an interconnect structure in an inter-layer dielectric (ILD) material, the method comprising:

forming a cap layer directly on top of said ILD material, wherein said ILD material is a porous material of hydrogenated amorphous silicon carbide (SiCH) with ultra-low dielectric constant (ULK), using a sputtering deposition process;

creating an opening in said cap layer using a photo-mask through a lithographic process for forming a via; said opening exposes at least a portion of said porous ILD material of SiCH due to misalignment;

treating the exposed portion of said porous ILD material of SiCH; wherein the treating includes using a gas cluster ion beam (GCIB) at a dosage of approximately between 0.1 and $10.0 \times 10^{15}$ ion-clusters/cm$^2$, preferably between 0.5 and $2.5 \times 10^{15}$ ion-clusters/cm$^2$, to bombard and irradiate said exposed portion of said porous ILD material of SiCH to create a densified area on the exposed portion of said porous ILD material of SiCH to prevent a metal element from penetrating into said porous material of SiCH, wherein said densified area forms a layer having a thickness from 10 Å to 500 Å; said exposed portion is a bottom surface of said via created in said porous ILD material of SiCH; and wherein a size of ion cluster of said GCIB is about 5 nm and is bigger than a size of about 1 to 2 nm of pore in said porous material of SiCH; and metallizing said densified area, wherein said metallizing includes depositing a barrier metal film subsequently on top of said densified area in the bottom of said via; forming a conductive material directly on top of said barrier metal film; and planarizing said conductive material to form said interconnect structure.

2. The method of claim 1, wherein using said GCIB comprises accelerating said GCIB at a voltage of approximately between 1.0 and 60 KeV, and preferably between 5 and 15 KeV.

3. The method of claim 1, wherein using said GCIB comprises generating said GCIB through a pure or mixture of inert and reactive gases.

4. The method of claim 3, wherein said inert gases comprise one or more gases of argon, neon, krypton, xenon, radon, nitrogen, and oxygen.

5. The method of claim 1, wherein said densified area forms a layer having a thickness from 50 Å to 250 Å.

6. The method of claim 1, comprising forming a bottom surface of said interconnect structure to create said exposed area of said ILD material.

* * * * *